(12) United States Patent
Bulumulla et al.

(10) Patent No.: US 7,746,074 B2
(45) Date of Patent: Jun. 29, 2010

(54) SYSTEM AND APPARATUS FOR REDUCING HIGH FIELD SHADING IN MR IMAGING

(75) Inventors: Selaka Bandara Bulumulla, Niskayuna, NY (US); Christopher Judson Hardy, Niskayuna, NY (US); Florian Wiesinger, Garching (DE)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/144,810

(22) Filed: Jun. 24, 2008

(65) Prior Publication Data

US 2009/0315562 A1 Dec. 24, 2009

(51) Int. Cl.
*G01V 3/00* (2006.01)
(52) U.S. Cl. ...................... 324/318; 324/322
(58) Field of Classification Search ......... 324/300–322; 600/407–435
See application file for complete search history.

(56) References Cited

U.S. PATENT DOCUMENTS

| 4,825,162 | A | 4/1989 | Roemer et al. | |
|---|---|---|---|---|
| 6,137,291 | A * | 10/2000 | Szumowski et al. | 324/318 |
| 6,747,454 | B2 * | 6/2004 | Belt | 324/318 |
| 6,906,518 | B2 | 6/2005 | Leussler | |
| 7,042,220 | B2 * | 5/2006 | Truong et al. | 324/309 |
| 7,075,302 | B2 * | 7/2006 | Zhu | 324/318 |
| 7,106,062 | B1 | 9/2006 | Hardy et al. | |
| 7,245,127 | B2 | 7/2007 | Feng et al. | |
| 7,282,915 | B2 | 10/2007 | Giaquinto et al. | |

OTHER PUBLICATIONS

Jones et al., "Signal Intensity Artifacts in Clinical MR Imaging," RadioGraphics, Imaging & Therapeutic Technology, May-Jun. 2000, vol. 20, No. 3, pp. 893-901.

* cited by examiner

*Primary Examiner*—Brij B Shrivastav
(74) *Attorney, Agent, or Firm*—Jason K. Klindtworth (57) ABSTRACT

A system for receiving MR data that includes an RF coil array for a magnetic resonance (MR) imaging apparatus. The RF coil array includes a plurality of non-concentric receiver coils arrayed along a first direction. A receiver coil at a first end of the RF coil array has a perimeter width greater than a perimeter width of a receiver coil at a second end of the RF coil array that is opposite from the first end along the first direction.

21 Claims, 4 Drawing Sheets

SYSTEM AND APPARATUS FOR REDUCING HIGH FIELD SHADING IN MR IMAGING

BACKGROUND OF THE INVENTION

The present invention relates generally to medical imaging systems, and more particularly, to a phased array coil for a magnetic resonance (MR) imaging system.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received nuclear magnetic resonance (NMR) signals are digitized and processed to reconstruct the image using one of many well known reconstruction techniques.

Over time, MR systems have progressed from low-field, single-channel systems toward high-field multi-channel systems, allowing highly accelerated parallel imaging. Despite continuous advances in conceptual understanding and MR hardware design, high-field imaging still poses significant challenges in terms of patient-dependent RF-wave interference effects (i.e., receiving sensitivity inhomogeneities in the form of RF-shading). With increasing $B_0$ and object size, the RF fields change from a quasi-static regime into a more wave-like regime and thereby become increasingly determined by the subject's properties. That is, a subject's size, shape and dielectric properties can affect RF fields, causing RF-wave interference effects. These RF-wave interference effects pose significant challenges for the design of high field coil arrays, which are aimed to consistently achieve uniform, high signal-to-noise ratio (SNR) performance, when applied to a broad patient population under various conditions.

MR receiver-coil arrays often use equally sized coil elements, with the center of the array co-aligned with the subject's inferior-superior axis. These arrays having equally sized coil elements may suffer from shifting of coil sensitivity patterns relative to the subject, although such shifting may be minimal for $B_0$ values of 1.5 T or lower. This shifting often stems from the local intensity shift artifact (LISA). For larger $B_0$ values, such as 3 T or higher, MR images acquired from these receiver coil arrays having equally sized coil elements often show greater variation in SNR in the plane transverse to the $B_0$ field, which causes shading in the MR image and degrades overall image quality. The direction of the shading depends on the direction of the static $B_0$ field relative to the subject and the placement of the receiver coil array. Take, for example, a $B_0$ field pointing from the subject's feet toward the subject's head and a conventional coil array placed underneath the supine subject. In such an example, the left side of an acquired coronal image, which corresponds to the subject's right side, is typically brighter than the right side of the coronal image. In addition, shading effects can also be seen along the anterior-posterior axis of the MR image. If, on the other hand, the $B_0$ direction is reversed, pointing in the subject's head-to-feet direction, the right side of an acquired coronal image is typically brighter than the left side. In addition, as with the first example, shading effects will also be present along the anterior-posterior axis relative to the image. These shading effects may present themselves to some degree for magnetic field strengths of 1.5 T or lower; however, the effect becomes more severe as field strength increases.

It would therefore be desirable to have a system and apparatus that increases SNR uniformity, thereby reducing shading artifacts.

BRIEF DESCRIPTION OF THE INVENTION

Embodiments of the invention provide a system and apparatus for receiving MR data that overcome the aforementioned drawbacks. An RF coil array includes a plurality of non-concentric receiver coils overlapping along a first direction. A receiver coil at a first end of the RF coil array has a perimeter width greater than a perimeter width of a receiver coil at a second end of the RF coil array that is opposite from the first end along the first direction.

In accordance with one aspect of the invention, an RF coil array for a magnetic resonance (MR) imaging apparatus includes a plurality of non-concentric receiver coils arrayed along a first direction. A receiver coil at a first end of the RF coil array has a perimeter width greater than a perimeter width of a receiver coil at a second end of the RF coil array that is opposite from the first end along the first direction.

In accordance with another aspect of the invention, a magnetic resonance (MR) coil array having a plurality of receiving coils includes a first receiving coil having a perimeter that surrounds a first area, a second receiving coil having a perimeter that surrounds a second area, and a third receiving coil having a perimeter that surrounds a third area. The third area is less than the second area and the second area is less than the first area. Further, the second receiving coil is set off from the first receiving coil along a first direction. In addition, the third receiving coil is set off from the second receiving coil along the first direction.

In accordance with yet another aspect of the invention, a magnetic resonance imaging (MRI) apparatus includes an MRI system having a plurality of gradient coils positioned about a bore of a magnet, an RF transceiver system, and an RF switch controlled by a pulse module to transmit RF signals to a phased array to acquire MR images. The phased array includes a first coil having a first boundary surrounding a first area, a second coil having a second boundary surrounding a second area, and a third coil having a third boundary surrounding a third area. The length of the third boundary is less than the length of the second boundary and the length of the second boundary is less than the length of the first boundary. In addition, the first, second, and third coils are arrayed along a first direction such that the second coil is offset in a first direction from the first coil and the third coil is offset in the first direction from the second coil.

Various other features and advantages will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
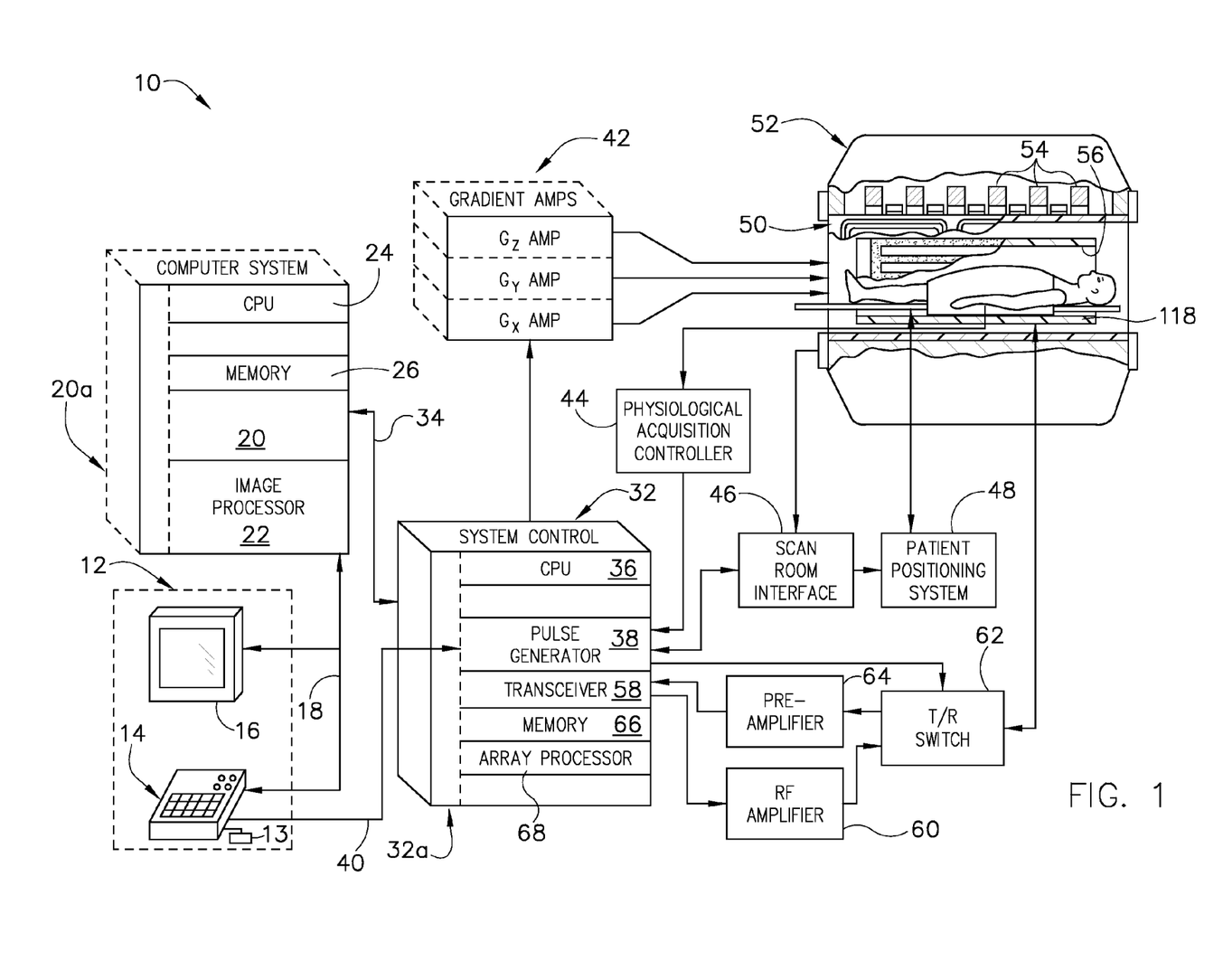
FIG. 1 is a schematic diagram of an exemplary MR imaging system for use with embodiments of the present invention.

Referring to FIG. 1, the major components of an exemplary magnetic resonance imaging (MRI) system 10 incorporating embodiments of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. In an embodiment of the invention, RF coil 56 is a multi-channel coil. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. It is recognized that RF coil 56 may take the form of a dedicated receive coil integrated into a patient table 118. Alternatively, it is also recognized that a separate RF coil (for example, a surface coil) may be enabled by transmit/receive switch 62 and may be used in addition to or in lieu of RF coil 56.

The MR signals picked up by the multi-channel RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
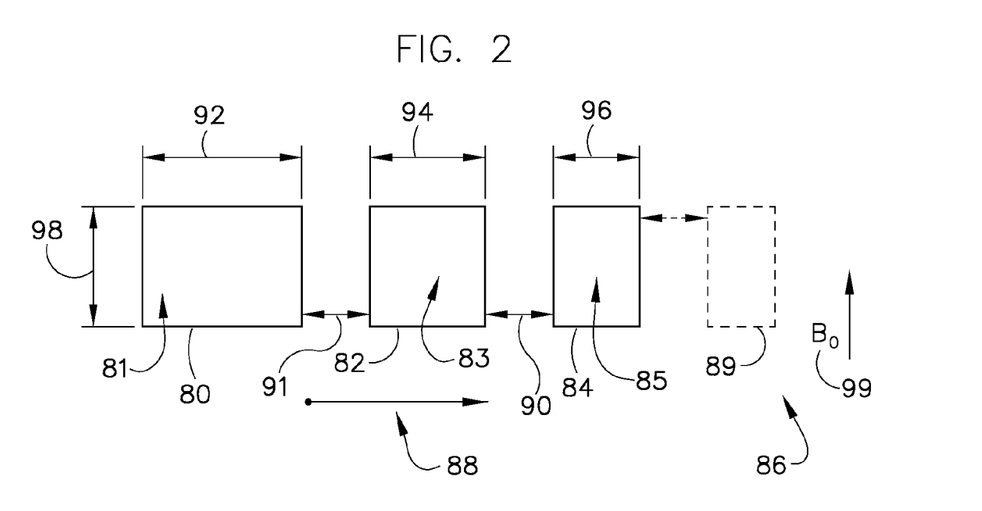
FIG. 2 is a top plan view of an RF coil array according to an embodiment of the invention.

Referring to FIG. 2, an embodiment of an asymmetric phased array of RF coils is depicted. Shown are three coils or elements 80-84 of a phased array 86, which may be a surface or local coil array or an array integrated into an MR system (e.g., MR system 10 of FIG. 1). The coils 80-84 are arranged or arrayed along a first direction 88. Though only three elements 80-84 are shown, it is contemplated that additional coils, such as the coil shown in phantom 89, could also be included in the phased array 86. As shown in the present embodiment 86, the elements 80-84 are set off from one another such that the elements 80-84 do not overlap. That is, the third element 84 is set off along the first direction 88 from the second element 82 such that there is a gap 90 between the third and second elements 82, 84. Likewise, the second element 82 is set off from the first element 80 along the first direction 88 such that the there is a gap 91 between the first and second elements 80, 82.

Still referring to FIG. 2, the phased array 86 comprises an asymmetric array where the coil or element size decreases along the first direction 88. More specifically, each of the coils or elements 80-84 has a perimeter width 92-96 that generally decreases in size relative to the preceding element. In particular, the third element perimeter width 96 is less than the second element perimeter width 94, and the second element perimeter width 94 is less than the first element perimeter width 92. Since the perimeter widths 92-96 are shown to decrease as the coil height 98 of each element 80-84 remains substantially constant, the area surrounded by the boundary of each element 80-84 varies along the first direction 88. That is, the area 81 of the first element 80 is greater than the area 83 of the second element 82, and the area 83 of the second element 82 is greater than the area 85 of the third element 84.

This variation in the perimeter widths 92-96 and the resulting variation in areas 81, 83, 85 enclosed by each element 80-84 help to increase SNR uniformity along the first direction 88 (i.e., in the direction of varying coil width), as well as increasing SNR uniformity along the direction 99 of the $B_0$ field. The increased SNR uniformity helps to decrease shading or intensity artifacts often found in coronal images acquired, for example, with a 3T system. As such, the phase array is configured to acquire MR data having minimized contributions to RF shading. The array 86 depicted in the present embodiment, and the remainder of the embodiments discussed herein, may be either surface or local coil arrays or a coil array integrated into an MR system (e.g., MR system 10 of FIG. 1).

Figure 3:
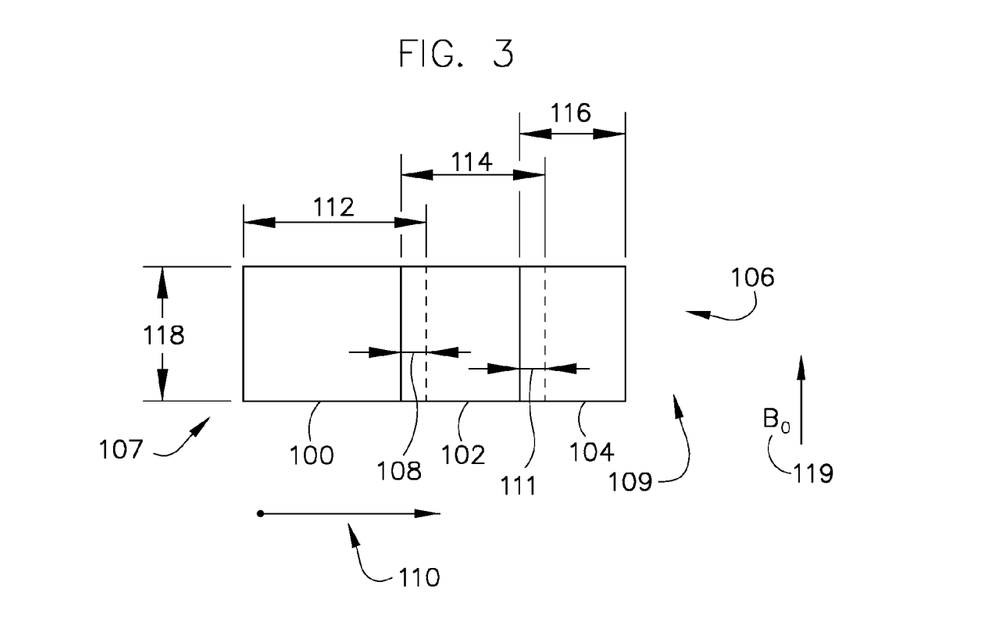
FIG. 3 is a top plan view of another RF coil array according to an embodiment of the invention.

Referring to FIG. 3, an embodiment of an asymmetric phased array of RF coils is depicted. Shown are three receiver coils or elements 100-104 of a phased array 106, which may be a surface or local coil array or an array integrated into an MR system (e.g., MR system 10 of FIG. 1). For purposes of illustration, only three elements 100-104 are shown, however, it is envisioned that additional coils could also be included in the phased array 106 to form, for example, an array having six coil elements. Included in array 106 is a first element 100 positioned at a first end 107 of array 106, a third element 104 positioned at a second end 109 of array 106, and a second or inside element 102 positioned between first and third elements 100, 104. As depicted, the elements 100-104 are of a parallelogram shape, and each element 100-104 overlaps at least one other element in the array 106 in a first direction 110 so as to minimize or eliminate inductive coupling. In other words, rather than each element 100-104 being set off from their immediate adjacent neighbor such that there is a gap between them (e.g., gaps 90, 91 shown in FIG. 2), each of the elements 100-104 are set off to a lesser degree such that each element overlaps its immediately adjacent neighbor. For example, the first element 100 overlaps the second element 102 in an overlap region 108 and the second element 102 overlaps the first element 100 in the overlap region 108 while also overlapping the third element 104 in an overlap region 111. Although the second element 102 overlaps the two end elements (i.e., the first and third elements 100, 104), the first and third elements 100, 104 only overlap one other element, i.e., second element 102. That is, the first element 100 and third element 104 are non-overlapping relative to each other. As such, the phased array 106 is arranged or arrayed in an overlapping manner along the first direction 110 such that each coil 100-104 is offset along a first direction 110 from immediately adjacent neighbors. Only a portion of the area defined by each coil 100-104 is overlapped by a neighboring coil. That is, overlap regions 108, 111 are intersections between respective overlapping coils that are not created by concentric coils. The first direction 110 in which the overlapping occurs is substantially perpendicular to the $B_0$ field 119. Accordingly, elements 100-104 overlaps in a direction substantially perpendicular to the $B_0$ field 119.

As shown in FIG. 3, the phased array 106 comprises an asymmetric array, such that the size of each of the coils 100-104 differs from that of each of the other coils. More specifically, each of the coils or elements 100-104 has a perimeter width 112-116 that generally decreases in size in a direction proceeding from first element 100 at first end 107 to the third element 104 at second end 109. In particular, the third element perimeter width 116 is less than the second element perimeter width 114, and the second element perimeter width 114 is less than the first element perimeter width 112. Since the perimeter widths 112-116 are shown to decrease as the coil height 118 of each element 100-104 remains substantially constant, the area surrounded by the boundary of each element 100-104 varies along the left-right direction 110. That is, the area of the first element 100 is greater than the area of the second element 102, and the area of the second element 102 is greater than the area of the third element 104. It is noted that each overlapping region 108, 111 is less than the area enclosed by the boundary of the second and third elements 102, 104, respectively. This variation in the perimeter widths 112-116 and the resulting variation in areas enclosed by each element 100-104 help to increase SNR uniformity. In other words, the direction of the $B_0$ field 119 in relation to the asymmetric array helps the SNR in the right portion of the array 106 approach the magnitude of the SNR in the left portion of the array 106. Further, SNR uniformity is also increased along the axis of the $B_0$ field. The increased SNR uniformity helps to decrease shading or intensity artifacts often found in coronal images acquired, for example, with a 3T system. The array 106 depicted in the present embodiment, and the remainder of the embodiments discussed herein, may be either surface or local coil arrays or a coil array integrated into an MR system (e.g., MR system 10 of FIG. 1).

Figure 4:
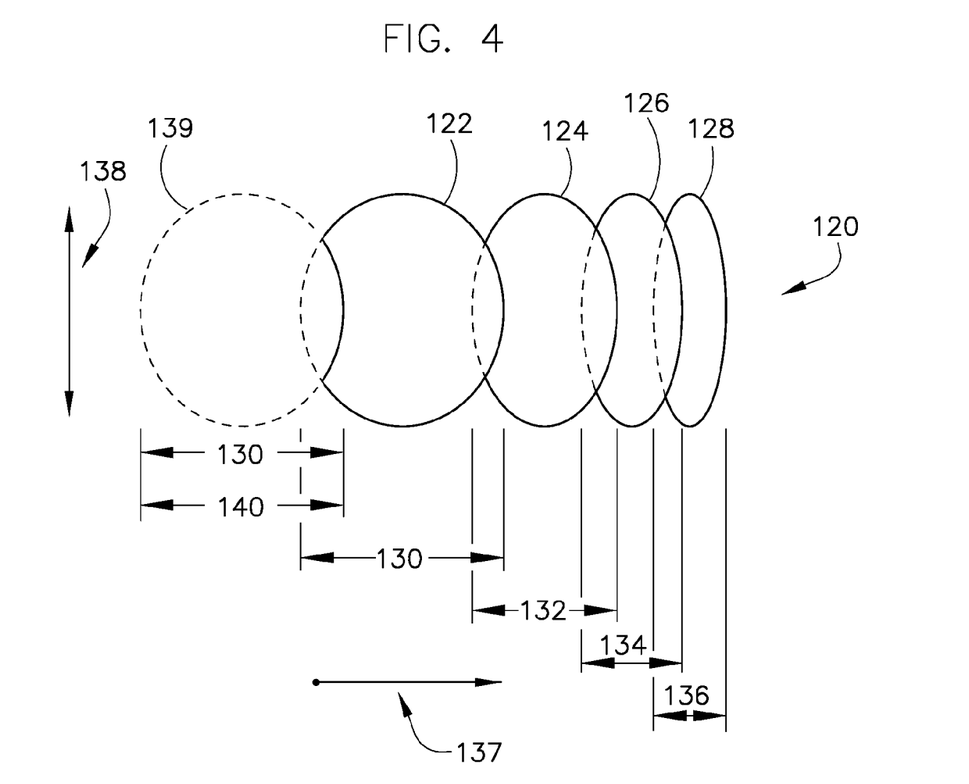
FIG. 4 is a top plan view of yet another RF coil array according to an embodiment of the invention.

Though FIG. 3 depicts the coils or elements 100-104 being a generally parallelogram shape, it is contemplated that the coils of an array could take on other shapes. For example, the elements could also be generally elliptical in shape, as shown in FIG. 4. FIG. 4 shows a four coil array 120, with each element or coil 122-128 being generally elliptical in shape. Here, four coils 122-128 are shown having varying widths 130-136. That is, the widths 130-136 decrease in magnitude or size in the first direction 137. Further, the height 138 of each coil preferably remains substantially the same. As such, the lengths of the boundaries of each of the coils 122-128 vary in the first direction 137. That is, the length of the boundary around the fourth coil 128 is less than the length of the boundary of the third coil 126. In turn, the length of the boundary of the third coil 126 is less the length of the boundary of the second coil 124, and the length of the boundary of the second coil 124 is less than the length of the boundary of the first coil 122. Though four coils 122-128 are depicted in the present embodiment, it is contemplated that additional elements could be used in a manner consistent with the present embodiment, and those embodiments described herein. For example, an additional element 139 (shown in phantom) has a width 140 that is substantially the same magnitude as the first element width 130. As such, the length of the boundary of the additional element 139 may be substantially equal to the length of the boundary of the first coil 122. As with the embodiment shown in FIG. 2, the element widths 130-136 vary in the first direction 137 to help keep the SNR more uniform. Accordingly, such an array 120 helps to minimize the shading effect that often arises when using conventional arrays.

As presented in FIGS. 2-4, two arrays 86, 106, with generally parallelogram shaped elements 80-84, 100-104 and an array 120 with elliptical shaped elements 122-128, 139 are shown. As previously mentioned, however, it is contemplated that a wide variety of element shapes could be used in the asymmetric array taught herein.

Figure 5:
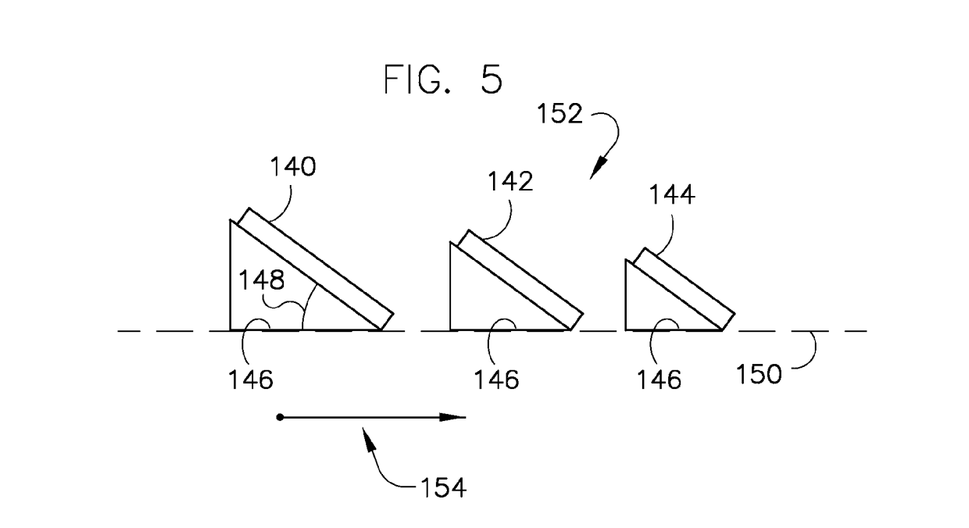
FIG. 5 is a side plan view of an RF coil array having tilted coils according to an embodiment of the invention.

Referring to FIG. 5, an embodiment is shown that illustrates coil orientations of an array. As depicted in the present embodiment, each coil 140-144 is placed on a dielectric bed or wedge 146 such that each coil 140-144 is at an angle 148, or tilted, relative to an array plane 150. The asymmetric phased array 152 has a plurality of coils 140-144 with decreasing widths according to an embodiment of the invention. The plurality of coils 140-144 are arranged along a first direction 154. By employing coil tilting where appropriate, SNR may be increased in portions of the array 152. As such, SNR can reach a greater uniformity to reduce shading effects in MR images. Though the embodiment of FIG. 5 shows that each coil 140-144 is tilted at a non-parallel angle 148 relative to the array plane 150, it is contemplated that less than all coils of an array could be tilted to the non-parallel angle 148. Further, it is contemplated that the non-parallel angle 148 may be greater than zero degrees and less than three hundred and sixty degrees. In addition, though the elements 140-144 are shown tilted at a non-parallel angle 148, it is contemplated that a parallel angle (i.e., a zero angle) could be employed. In such an embodiment, each coil would be parallel to the array plane 150.

Figure 6:
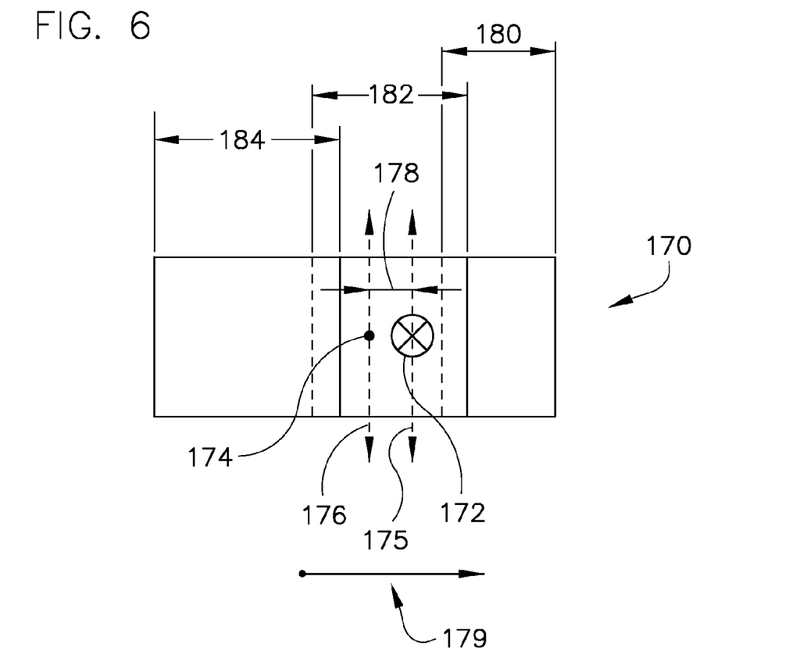
FIG. 6 is a top plan view of another RF coil array according to an embodiment of the invention.

Referring now to FIG. 6, an embodiment is depicted that illustrates an asymmetric array 170 oriented such that a center of an anatomy-of-interest 172 is off-centered from the center of the array 174. In other words, the array 170 is off-centered from the center line of examination 175, where the center line of examination runs along the z-axis or superior-inferior axis of an examined object. For example, the center line of examination 175 may be coincident with a subject's spine. As such, with the anatomy-of-interest 172 being a subject's spine, the array 170 may be oriented as shown in FIG. 6, with the array 170 being offset such that a center axis of symmetry 176 of the array 170, which runs through the center 174 of the array 170, is shifted 178 from the center of anatomy-of-interest 172. Such an orientation or placement of the asymmetric array 170 further increases SNR uniformity for the feature or anatomy of interest. Again, the array 170 is arranged along a first direction 179 with the third element width 180 being less than the second element width 182, and the second element width 182 is less than the first element width 184.

While each of the embodiments set forth above in FIGS. 2-6 are shown and described separately, it is envisioned that the embodiments are not mutually exclusive. For example, it is envisioned that a phased array of RF receiver coils can have differing widths so as to form an asymmetrical coil array, and the asymmetrical array can be shifted off-center. It is also envisioned that a phased array of RF receiver coils can have differing widths so as to form an asymmetrical coil array, and one or more of the coils may be tilted relative to the imaging plane. Additionally, aspects of each embodiment may be combined. That is, it is contemplated that an asymmetrical array having differing widths may be shifted off-center and have one or more coils tilted.

Figure 7:
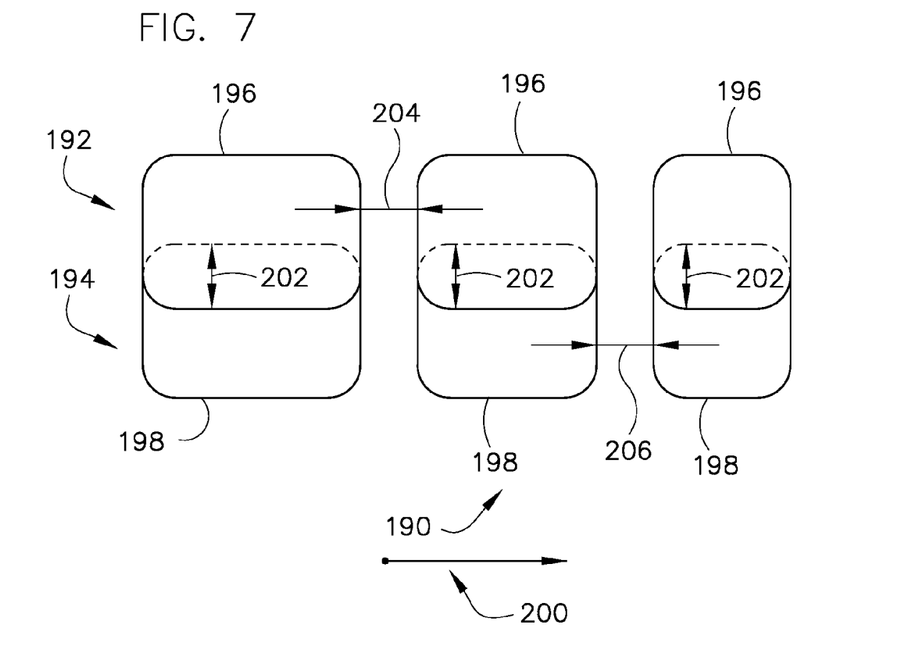
FIG. 7 is a top plan view of two-dimensional RF coil array according an embodiment of the invention.

Referring now to FIG. 7, a top plan view of a two-dimensional RF receiver coil array 190 is depicted. As shown, the two-dimensional RF receiver-coil array 190 includes two receiver-coil arrays 192, 194 with their elements 196, 198 arrayed along a first direction 200. The top array 192 includes three coil elements 196 set off from one another along a first direction 200, where the coil elements 196 decrease in size along the first direction 200. The bottom receiver-coil array 194 also includes three coil elements 200 set off from one another along the first direction 200, where the bottom array 194 coil elements 200 decrease in size along the first direction 200. As such, and as with the other embodiments depicted herein, the two receiver-coil arrays 192, 194 are configured to acquire MR data having minimized contributions to RF shading. As shown, the two arrays 192, 194 overlap 202 one another to help minimize inductive coupling. Though only two arrays 192, 194 are depicted in this two-dimensional RF coil array 190, it is contemplated that additional arrays may be incorporated into the two-dimensional RF coil array 190. Further, it is also contemplated that each array employed (e.g., the top and bottom array 192, 194, respectively) could be comprised of more than three elements, rather than only the three elements depicted 196, 198. As with the other embodiments discussed, array shifting and coil tilting may also be employed in a manner consistent with the invention.

In addition, though the elements 196, 200 of the arrays 192, 194, respectively of FIG. 7 are depicted as set off from one another along the first direction 200 but not overlapping (i.e., separated by a gap 204, 206), it is contemplated that the elements 196, 200 of each array 192, 194 could be arrayed such that they are set off from one another while overlapping such as shown in the embodiment of FIG. 3.

In accordance with one embodiment, an RF coil array for a magnetic resonance (MR) imaging apparatus includes a plurality of non-concentric receiver coils arrayed along a first direction. A receiver coil at a first end of the RF coil array has a perimeter width greater than a perimeter width of a receiver coil at a second end of the RF coil array that is opposite from the first end along the first direction.

In accordance with another embodiment, a magnetic resonance (MR) coil array having a plurality of receiving coils includes a first receiving coil having a perimeter that surrounds a first area, a second receiving coil having a perimeter that surrounds a second area, and a third receiving coil having a perimeter that surrounds a third area. The third area is less than the second area and the second area is less than the first area. Further, the second receiving coil is set off from the first receiving coil along a first direction. In addition, the third receiving coil is set off from the second receiving coil along the first direction.

In accordance with yet another embodiment, a magnetic resonance imaging (MRI) apparatus includes an MRI system having a plurality of gradient coils positioned about a bore of a magnet, an RF transceiver system, and an RF switch controlled by a pulse module to transmit RF signals to a phased array to acquire MR images. The phased array includes a first coil having a first boundary surrounding a first area, a second coil having a second boundary surrounding a second area, and a third coil having a third boundary surrounding a third area. The length of the third boundary is less than the length of the second boundary and the length of the second boundary is less than the length of the first boundary. In addition, the first, second, and third coils are arrayed along a first direction such the second coil is offset in a first direction from the first coil and the third coil is offset in the first direction from the second coil.

The present invention has been described in terms of the preferred embodiment, and it is recognized that equivalents, alternatives, and modifications, aside from those expressly stated, are possible and within the scope of the appending claims.

What is claimed is:

1. A two-dimensional RF coil array for a magnetic resonance (MR) imaging apparatus comprising:
    a plurality of receiver coil arrays wherein at least one of the receiver coil arrays comprises a plurality of non-concentric receiver coils arrayed along a first direction, wherein a receiver coil at a first end of the at least one receiver coil array has a perimeter width greater than a perimeter width of a receiver coil at a second end of the at least one receiver coil array that is opposite from the first end along the first direction.

2. The RF coil array of claim 1 wherein the plurality of non-concentric receiver coils are configured such that each coil between the receiver coil at the first end and the receiver coil at the second end overlap two other coils along the first direction.

3. The RF coil array of claim 1 further comprising a dielectric bed, wherein the plurality of non-concentric receiver coils are arrayed in a plane and at least one of the plurality of non-concentric receiver coils is coupled to the dielectric bed such that the at least one of the plurality of receiver coils is tilted at a non-parallel angle relative to the plane of the array.

4. The RF coil array of claim 1 wherein the RF coil array comprises one of a surface coil array and a table-integrated coil array.

5. The RF coil array of claim 1 wherein the RF coil array is configured such that a center of an anatomy of interest is off-centered from a center of the RF coil array.

6. The RF coil array of claim 1 wherein each of the plurality of non-concentric receiver coils is generally elliptical in shape.

7. The RF coil array of claim 1 wherein the perimeter width of each of the plurality of non-concentric receiver coils is reduced from the first end of the RF coil array to the second end of the RF coil array.

8. The RF coil array of claim 1 wherein the plurality of non-concentric receiver coils are arranged in a first direction substantially perpendicular to a B0 field.

9. The RF coil array of claim 1 wherein the RF coil array is configured to operate in a 3.0 Tesla static field.

10. A two-dimensional magnetic resonance (MR) coil array comprising:
a plurality of receiving coil arrays, wherein at least one of the receiving coil arrays comprises
a first receiving coil having a perimeter that surrounds a first area;
a second receiving coil having a perimeter that surrounds a second area, wherein the second area is less than the first area, and wherein the second receiving coil is set off in a first direction from the first receiving coil; and
a third receiving coil having a perimeter that surrounds a third area, wherein the third area is less than the second area, and wherein the third receiving coil is set off in the first direction from the second receiving coil.

11. The MR coil array of claim 10 wherein each of the plurality of receiving coils are elliptically shaped.

12. The MR coil array of claim 10 wherein the at least one of the receiving coil arrays comprises a plurality of receiving coils arrayed in an array plane and wherein at least one of the plurality of receiving coils is placed on a dielectric bed such that the at least one of the plurality of receiving coils is oriented at a non-parallel angle to the array plane.

13. The MR coil array of claim 10 wherein the MR coil array comprises one of a local coil array and a table-integrated coil array.

14. The MR coil array of claim 10 wherein the MR coil array is oriented such that a center of the MR coil array is offset from a center of an anatomical region of interest.

15. The MR coil array of claim 10 wherein a width of the first area is greater than a width of the second area, and wherein the width of the second area is greater than a width of the third area.

16. A magnetic resonance imaging (MRI) apparatus comprising:
an MRI system having a plurality of gradient coils positioned about a bore of a magnet; and
an RF transceiver system and an RF switch controlled by a pulse module to transmit RF signals to a two-dimensional phased array to acquire MR images, the two-dimensional phased array comprising:
a first coil having a first boundary surrounding a first area;
a second coil having a second boundary surrounding a second area, wherein a length of the second boundary is less than a length of the first boundary;
a third coil having a third boundary surrounding a third area, wherein a length of the third boundary is less than the length of the second boundary; and
wherein the first, second, and third coils are arrayed along a first direction such that the second coil is offset in a first direction from the first coil and such that the third coil is offset in the first direction from the second coil.

17. The phased array of the MR imaging apparatus of claim 16 further comprising an additional receiving coil positioned such that the first receiving coil is set off from the additional receiving coil along the first direction, and wherein the additional receiving coil has a perimeter that surrounds an additional area that is substantially equal to the first area.

18. The MRI apparatus of claim 16 wherein the phased array is configured such that a center line of examination along a Z-axis of an object is shifted from an axis of symmetry of the phased array.

19. The MRI apparatus of claim 16 wherein each of the first, second, and third coils of the phased array are generally elliptical.

20. The MRI apparatus of claim 16 wherein each of the first, second, and third coils of the phased array are generally parallelogram-shaped.

21. The MRI apparatus of claim 16 wherein the phase array is configured to acquire MR data having minimized contributions to RF shading.

* * * * *

UNITED STATES PATENT AND TRADEMARK OFFICE
CERTIFICATE OF CORRECTION

PATENT NO.        : 7,746,074 B2
APPLICATION NO.   : 12/144810
DATED             : June 29, 2010
INVENTOR(S)       : Bulumulla et al.

Page 1 of 1

It is certified that error appears in the above-identified patent and that said Letters Patent is hereby corrected as shown below:

In Column 9, Line 20, in Claim 8, delete "B0" and insert -- $B_0$ --, therefor.

Signed and Sealed this

Twenty-fourth Day of August, 2010

David J. Kappos
*Director of the United States Patent and Trademark Office*